US012696813B2

(12) United States Patent
Zhu et al.

(10) Patent No.: US 12,696,813 B2
(45) Date of Patent: Jul. 28, 2026

(54) METHOD FOR MANUFACTURING AN OPTOELECTRONIC DEVICE

(71) Applicant: FOSHAN NATIONSTAR OPTOELECTRONICS CO., LTD., Foshan (CN)

(72) Inventors: Mingjun Zhu, Foshan (CN); Haojie Guo, Foshan (CN); Yurong Li, Foshan (CN); Meiqin Lei, Foshan (CN); Yan Chen, Foshan (CN); Jundong Qiu, Foshan (CN); Yinling Zheng, Foshan (CN)

(73) Assignee: FOSHAN NATIONSTAR OPTOELECTRONICS CO., LTD., Foshan (CN)

( * ) Notice: Subject to any disclaimer, the term of this patent is extended or adjusted under 35 U.S.C. 154(b) by 409 days.

(21) Appl. No.: 18/380,706

(22) Filed: Oct. 17, 2023

(65) Prior Publication Data

US 2024/0203937 A1 Jun. 20, 2024

(30) Foreign Application Priority Data

Dec. 14, 2022 (CN) .......................... 202211605200.0

(51) Int. Cl.
*H10W 90/00* (2026.01)
*H10W 72/30* (2026.01)
*H10W 72/50* (2026.01)

(52) U.S. Cl.
CPC ............ *H10W 90/00* (2026.01); *H10W 72/30* (2026.01); *H10W 72/50* (2026.01)

(58) Field of Classification Search
CPC ..... H10W 90/00; H10W 72/30; H10W 72/50; H10W 72/851; H10F 77/50
See application file for complete search history.

(56) References Cited

U.S. PATENT DOCUMENTS

2004/0154163 A1 * 8/2004 Miyazaki ............ H01L 23/3107
257/725
2020/0091215 A1 * 3/2020 Jang ...................... H10F 39/804

* cited by examiner

*Primary Examiner* — Changhyun Yi
(74) *Attorney, Agent, or Firm* — CM Law; Stephen J. Weed

(57) ABSTRACT

Provided is a method for manufacturing an optoelectronic device. The manufacturing method includes the following steps: In S1, a monolithic circuit board including multiple device units is manufactured. In S2, a chip is mounted on the first pad of the device unit, and the chip is electrically connected to the second pad so that a monolithic circuit board with the chip is obtained. In S3, the monolithic circuit board with the chip is encapsulated to obtain a monolithic optoelectronic device. In S4, the monolithic optoelectronic device is cut into individual optoelectronic devices. The method for manufacturing an optoelectronic device of the present disclosure can solve problems of substrate deformation and chips falling off and cracking during the manufacturing process of large-size and thin optoelectronic devices, thereby improving the yield rate.

14 Claims, 5 Drawing Sheets

METHOD FOR MANUFACTURING AN OPTOELECTRONIC DEVICE

CROSS-REFERENCE TO RELATED APPLICATIONS

This disclosure claims priority to Chinese Patent Application No. 2022116052000.0 filed Dec. 14, 2022, the disclosure of which is incorporated herein by reference in its entirety.

TECHNICAL FIELD

The present disclosure relates to a method for manufacturing an optoelectronic device.

BACKGROUND

As wearable devices become increasingly popular, the forms of smart wear are becoming more and more diverse, with additional functions being increasingly abundant. Heart rate and blood oxygen are almost the standard features of smart wear. Smart wearable devices, such as smart watches, are very limited in size, and generally employ reflective photoelectric detection solutions where a light source emitting LED is on one side and a receiving terminal is on the other side. The heart rate and blood oxygen are detected in real time by the change of reflected light to achieve human health monitoring and body-building tracking.

In view of the trend of high photoelectric sensitivity and thin thickness of devices in the field of smart wearables, inventors have carried out research and development on optoelectronic devices used as receiving terminals. The inventors improve the sensitivity of the devices to light reception by using large-sized chips and make optoelectronic devices thinner by reducing the thickness of chips and substrates. For the manufacturing of optoelectronic devices, generally, a monolithic optoelectronic device is manufactured first where a monolithic substrate is used as the carrier on which multiple optoelectronic device units, and then the monolithic optoelectronic device is cut to acquire individual devices. In the production of the monolithic optoelectronic device, there is a high-temperature and high-pressure process. With a chip large in the area as well as a substrate and the chip extremely thin in thickness, the process often causes deformation in the monolithic substrate and then causes the chip to fall off from the substrate or crack, resulting in a low yield rate of the product.

SUMMARY

Based on this, the present disclosure aims to provide a method for manufacturing an optoelectronic device, which can solve problems of substrate deformation and chips falling off and cracking during the manufacturing process of large-size and thin optoelectronic devices, thereby improving the yield rate.

The present disclosure relates to a method for manufacturing an optoelectronic device. The method includes S1, S2, S3, and S4. In S1, a monolithic substrate is divided into multiple device unit regions, a first pad and a second pad are formed in each device unit region on the front of the monolithic substrate, and a first electrode electrically connected to the first pad, a second electrode electrically connected to the second pad, and a metal reinforcing plate disposed between the first electrode and the second electrode are formed in each device unit region on the back of the monolithic substrate, where the metal reinforcing plate has the same thickness as the first electrode and the second electrode. In this manner, a device unit is formed in each device unit region, and a monolithic circuit board including multiple device units is obtained. In S2, a chip is mounted on the first pad of the device unit, and the chip is electrically connected to the second pad so that a monolithic circuit board with the chip is obtained. In S3, the monolithic circuit board with the chip is encapsulated to obtain a monolithic optoelectronic device. In S4, the monolithic optoelectronic device is cut into individual optoelectronic devices.

In the method for manufacturing an optoelectronic device according to the present disclosure, a metal reinforcing plate with the same thickness as the electrodes is formed between two electrodes when a monolithic circuit board is formed, which can support the substrate portion between the two electrodes in the same manner as the electrodes. In a subsequent manufacturing process, the substrate portion between the two electrodes is not dented and deformed toward the side of electrodes even if the substrate is subjected to pressure from the front to the back. Thus, in the case where a chip is mounted on the monolithic circuit board, the chip is not separated from the substrate or cracked due to the bending of the substrate.

In an embodiment, the maximum width of the metal reinforcing plate in the first direction is greater than ½ of the spacing between the first electrode and the second electrode; the width of the metal reinforcing plate in the second direction is greater than ½ of the width of the device unit in the second direction; the first direction is a direction connecting the center point of the first electrode and the center point of the second electrode; the second direction is a direction parallel to the back of the monolithic substrate and orthogonal to the first direction.

In an embodiment, in each device unit, the minimum spacing between the metal reinforcing plate and the second electrode is greater than or equal to 0.3 mm.

In an embodiment, in the step S1, in the direction of the length of the monolithic circuit board, the spacing between adjacent device units is greater than or equal to 0.8 times the width of one device unit in the direction of the length.

In an embodiment, in the step S1, in the direction of the length of the monolithic circuit board, the spacing between adjacent device units is 0.8-1 times the width of one device unit in the direction of the length.

In an embodiment, the thickness of the monolithic substrate is less than or equal to 0.25 times the thickness of the optoelectronic device.

In an embodiment, the area of the chip is greater than or equal to 0.6 times the area of the optoelectronic device.

In an embodiment, the thickness of the optoelectronic device is less than 1 mm; when viewed from the top of the optoelectronic device, the optoelectronic device has a square shape with the length and width each greater than or equal to 3 mm.

In an embodiment, in the step S3, encapsulation includes the following steps: An upper die of a die press absorbs the back of the monolithic circuit board with the chip; encapsulation adhesive is injected into a lower die of the die press; the upper die and the lower die are closed.

Additionally, the present disclosure also provides an optoelectronic device manufactured by the preceding method for manufacturing the optoelectronic device.

For better understanding and implementation, the present disclosure is described in detail below in conjunction with accompanying drawings.

DETAILED DESCRIPTION

In the method for manufacturing an optoelectronic device according to the present disclosure, a metal reinforcing plate is formed between two electrodes of each device unit at the initial stage of manufacturing, which can solve problems of substrate deformation and chips falling off and cracking during the manufacturing process of large-size and thin optoelectronic devices, thereby improving the yield rate.

The method for manufacturing an optoelectronic device according to the present disclosure is performed in the following steps in sequence:

In S1, a monolithic substrate is divided into multiple device unit regions, a first pad and a second pad are formed in each device unit region on the front of the monolithic substrate, and a first electrode electrically connected to the first pad, a second electrode electrically connected to the second pad, and a metal reinforcing plate disposed between the first electrode and the second electrode are formed in each device unit region on the back of the monolithic substrate, where the metal reinforcing plate has the same thickness as the first electrode and the second electrode. In this manner, one device unit is formed in each device unit region, and a monolithic circuit board including multiple device units is obtained.

In S2, a chip is mounted on the first pad of the device unit, and the chip is electrically connected to the second pad, so that a monolithic circuit board with the chip is obtained.

In S3, the monolithic circuit board with the chip is encapsulated to obtain a monolithic optoelectronic device.

In S4, the monolithic optoelectronic device is cut into individual optoelectronic devices.

It should be noted that the manufacturing method of the present disclosure may include steps in addition to these four steps as necessary. Other steps performed as necessary are described hereinafter.

S1: Manufacture a Monolithic Circuit Board Including Multiple Device Units

In the step S1, the monolithic circuit board may be manufactured by the following steps of S101 to S103.

In S101, a drawing of a monolithic circuit board is designed. Specifically, with a monolithic substrate as an object, multiple device unit regions are divided on the monolithic substrate, and the circuit pattern is designed to process a device unit corresponding to a final individual optoelectronic device in each device unit region.

Figure 1A:
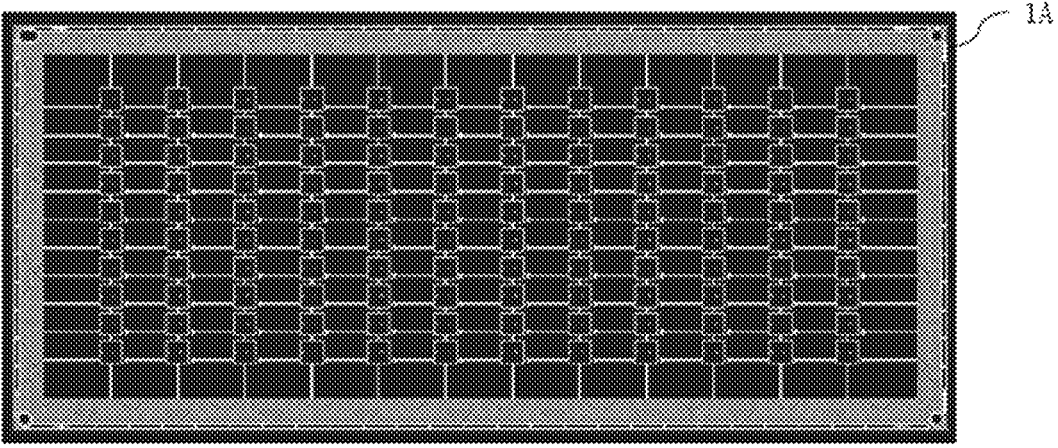
FIG. 1A is a front view of a monolithic circuit board 1A according to the present disclosure.
Figure 1B:
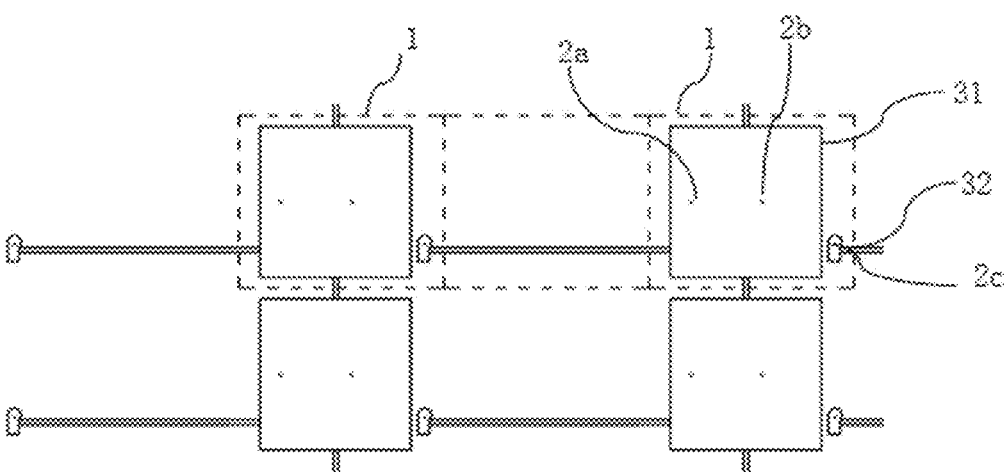
FIG. 1B is a partial schematic diagram of FIG. 1A.
Figure 2A:
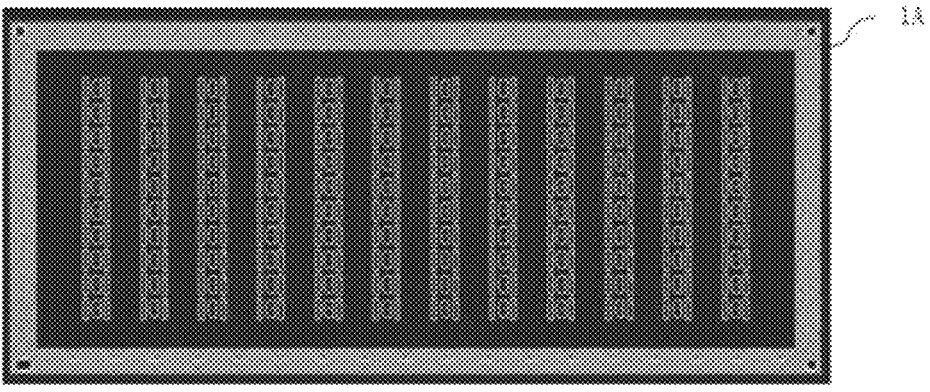
FIG. 2A is a back view of the monolithic circuit board 1A according to the present disclosure.
Figure 2B:
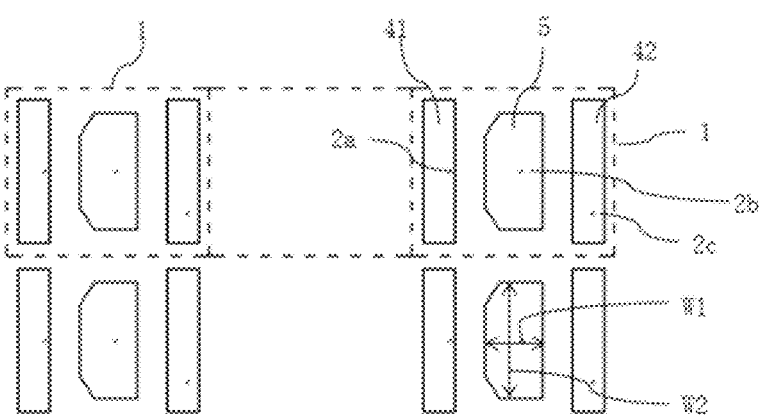
FIG. 2B is a partial schematic diagram of FIG. 2A.

For ease of understanding, the design of the circuit pattern is described with reference to the manufactured monolithic circuit board. FIGS. 1A and 1B are a front view of the monolithic circuit board 1A and a schematic diagram illustrating a part of FIG. 1A respectively. FIGS. 2A and 2B are a back view of the monolithic circuit board 1A and a schematic diagram illustrating a part of FIG. B respectively. A device unit 1 is shown in a dotted box.

Specifically, as shown in FIG. 1A, each device unit 1 includes a first pad 31 and a second pad 32 on the front of the monolithic circuit board 1A. As shown in FIG. 2B, each device unit 1 includes a first electrode 41, a second electrode 42, and a metal reinforcing plate 5 disposed between the first electrode 41 and the second electrode 42 on the back of the monolithic circuit board 1A. Additionally, each device unit 1 is provided with a first via 2a, a second via 2b, and a third via 2c which penetrate through the monolithic substrate. The first via 2a communicates the first pad 31 with the first electrode 41. The second via 2b communicates the first pad 31 with the metal reinforcing plate 5. The third via 2c communicates the second pad 32 with the second electrode 42.

S102: A via with a metal layer is formed. According to the preceding drawing design, the monolithic substrate is drilled from top to bottom using a drilling machine to penetrate through the front and the back of the substrate so as to form a first via 2a, a second via 2b, and a third via 2c on each device unit 1. Further, in a step of copper deposition, that is, in a solution containing metal ion portion, copper is deposited on the hole wall of each via to achieve a metallization effect in the vias. In this manner, the non-conductive substrate material forms a conductive metal layer to facilitate subsequent copper electroplating.

S103: A pad, an electrode, and a metal reinforcing plate are formed. First, in a copper plating tank, copper metal components in the solution are plated on the surface of the monolithic substrate by a method where current is applied to generate electrolytic reduction so that a layer of metal conductive layer is formed on both the front and the back of the monolithic substrate. Then, a part of the metal conductive layer is removed by a method commonly used in the art, such as stamping, exposure, development, and etching so that the front and the back of the monolithic substrate present the circuit pattern shown in FIGS. 1 and 2. That is, a first pad 31, a second pad 32, a first electrode 41, a second electrode 42, and a metal reinforcing plate 5 are formed in each device unit region.

In an embodiment, the circuit pattern (metal conductive layer) may be further plated with a nickel layer and a gold layer. Specifically, nickel plating is an intermediate process before gold plating and after copper plating. Nickel plating enables the contact of the circuit board to maintain a low-resistance communication for a long time by virtue of non-oxidizing characteristic of precious metals so that copper atoms are prevented from gradually migrating into the gold layer under long-term use, and thus the purity of the gold layer is not reduced, the contact resistance does not rise, and original functions are not damaged. Therefore, the nickel layer may be used to prevent the migration between copper atoms and gold atoms. Gold plating can provide the circuit with good conductivity, resistance, corrosion resistance, and oxidation resistance, as well as excellent solder ability and fusion. However, the cost of gold is extremely high, and it may only be used locally.

In the preceding step S1, the pads, electrodes, and metal reinforcing plate according to the present disclosure may be made of copper, copper-nickel, or copper-nickel-gold. In this embodiment, as described in S102 and S103, the metal layer with vias, pads, electrodes, and metal reinforcing plate are formed by electroplating. However, in other embodiments, they may also be formed by methods such as electroless plating.

S2: Manufacture a Monolithic Circuit Board with Chips

The preceding step S2 is a step where each chip is fixed to a respective pad and is electrically connected to two electrodes. Specifically, for each device unit 1, a die bond adhesive is spotted on the first pad 31; then a chip 6 is placed on the die bond adhesive so that one side of the chip 6 is in close contact with the die bond adhesive; after the device unit 1 is baked in an oven at a high temperature, an electrode on the other side of the chip 6 is connected to the second pad 32 by using a thin metal line (wire). In this manner, the die bonding and wire bonding of each device unit are completed to obtain a monolithic circuit board 1B with chips. The die bond adhesive may be a commonly used conductive adhesive such as solder paste and silver paste. The wire may be a commonly used conductive material such as gold wire.

S3: Manufacture a Monolithic Optoelectronic Device

Figure 3:
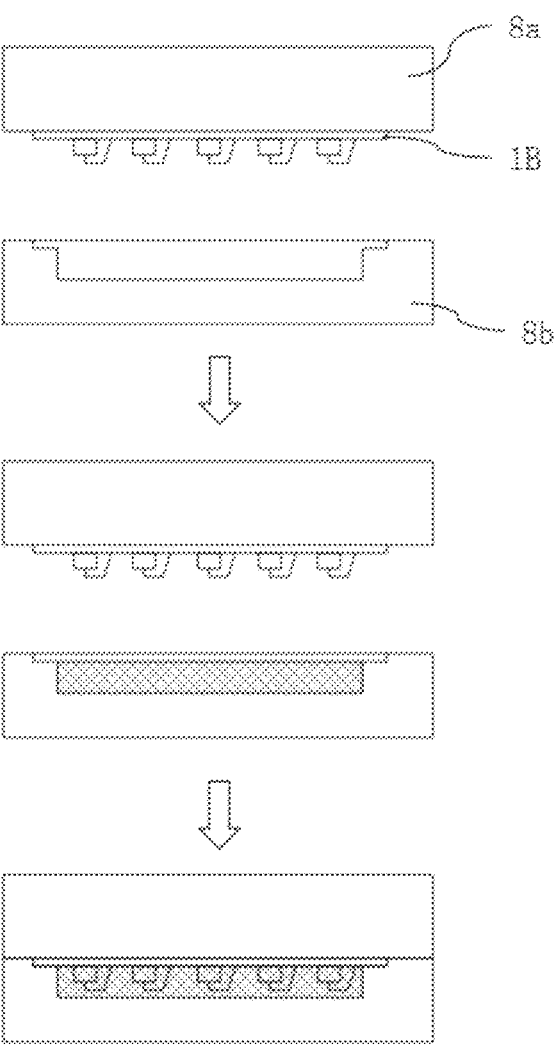
FIG. 3 is an example of a step S3 in the present disclosure.

In the preceding step S3, an encapsulation layer 7 may be formed by planar encapsulation, thereby obtaining a monolithic optoelectronic device. FIG. 3 is a diagram illustrating the process of planar encapsulation. A planar press (die press) is used for encapsulating the monolithic circuit board 1B with chips. Specifically, first, an upper die 8a of a die press vacuum-adsorbs the back (the back assembly is not shown) of the monolithic circuit board 1B with chips; then, encapsulation adhesive (shaded part) is injected into a lower die 8b of the die press; the upper die 8a and the lower die 8b are closed; after the encapsulation adhesive is cured, the upper die 8a is separated from the lower die 8b to obtain a monolithic optoelectronic device. The encapsulation adhesive may be selected as required, for example, a conventional transparent resin such as an epoxy resin may be used.

S4: Manufacture Individual Optoelectronic Devices

Figure 4:
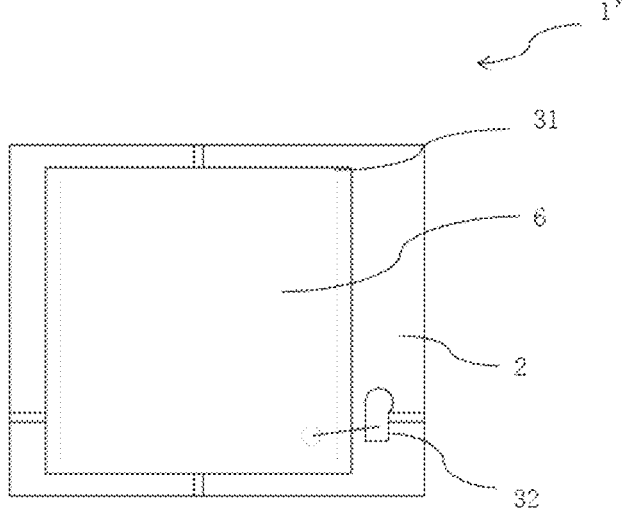
FIG. 4 is a front view of an optoelectronic device 1' obtained by the manufacturing method according to the present disclosure.
Figure 5:
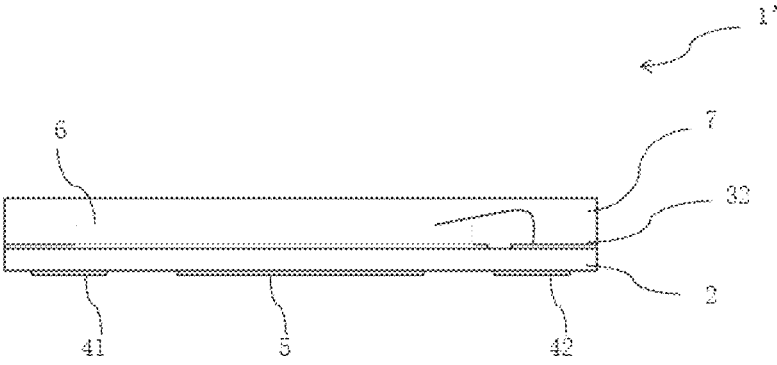
FIG. 5 is a side view of an optoelectronic device 1' obtained by the manufacturing method according to the present disclosure.

The preceding step S4 is a step where device units on the monolithic optoelectronic device are cut into individual optoelectronic devices 1'. Specifically, the monolithic optoelectronic device may be cut by a device such as a dicing machine. The obtained optoelectronic device 1' is shown in FIGS. 4 and 5, that is, the optoelectronic device 1' includes a substrate 2; a first pad 31, a second pad 32, a chip 6, an encapsulation layer 7, and a wire on the front of the substrate 2; and a first electrode 41, a second electrode 42, and a metal reinforcing plate 5 on the back of the substrate 2.

The present disclosure may use a BT substrate as the monolithic substrate for the BT substrate's toughness, temperature resistance, and pressure resistance. Moreover, the BT substrate has a reasonable price and is more suitable for planar encapsulation. Further, to make the thickness (that is, the width in the direction perpendicular to the front and back of the substrate) of the optoelectronic device thinner and occupy less space, the thickness of the substrate in the present disclosure may be less than or equal to 0.25 times the thickness of the optoelectronic device. For example, a substrate having a thickness of less than or equal to 0.2 mm may be used for an optoelectronic device having a thickness of 1 mm.

To increase the photocurrent received by the device to enhance the photoelectric sensitivity of the device, the present disclosure uses a light receiving chip with a large size and a thin thickness. The area (that is, the area in the direction parallel to the front and back of the substrate) of the chip according to the present disclosure is less than the area of the optoelectronic device. Meanwhile, the area of the chip may be greater than or equal to 0.6 times the area of the optoelectronic device. For example, for a square optoelectronic device with a length and a width both of 3 mm when viewed from the top (viewed from the front of the substrate), a square chip whose length and width are each greater than or equal to 2.5 mm may be used. To further miniaturize the optoelectronic device, the thickness of the chip may be less than or equal to 200 μm. Additionally, the chip may be a silicon-based chip.

In the manufacturing method according to the present disclosure, a metal reinforcing plate with the same thickness as the electrodes is formed between two electrodes when a monolithic circuit board is formed, which can support the substrate portion between the two electrodes in the same manner as the electrodes. In a subsequent manufacturing process, the substrate portion between the two electrodes is not dented and deformed toward the side of electrodes even if the monolithic circuit board is subjected to pressure from the front to the back. Thus, in the case where a chip is mounted on the monolithic circuit board, the chip is not separated from the substrate or cracked due to the bending of the substrate. Moreover, since made of the same material and formed simultaneously when the circuit is formed, the metal reinforcing plate and the electrodes have the same expansion coefficients. Even under high-temperature conditions, the metal reinforcing plate can also maintain the same thickness as the two electrodes to support the substrate, without causing the substrate to bend due to the difference in expansion coefficients and height difference.

In particular, for example, when the monolithic circuit board 1B with chips is absorbed (the pressure is about 5-7 tons) by the upper die of the press from the back of the monolithic circuit board 1B in the preceding process of encapsulation, if no metal reinforcing plate is provided, the substrate between two electrodes of each device unit is easy to sag and deform in the direction of the upper die, causing the chip to separate from the substrate or crack; even if a reinforcing layer (for example, smearing ink) of other materials of the same thickness is configured between the two electrodes for auxiliary support, a height difference exists between the electrodes and the reinforcing layer due to high temperature of encapsulation and thinness of the substrate and chip, causing the chip to separate from the substrate or crack.

According to the method for manufacturing an optoelectronic device of the present disclosure, an optoelectronic device 1' may be manufactured whose overall thickness is less than 1 mm and whose length and width are both greater than or equal to 3 mm. Additionally, the substrate is not deformed in the manufacturing process so that the chip does not separate from the substrate or crack, thereby greatly improving the yield rate of the product.

In an embodiment, the thickness of the electrodes and the metal reinforcing plate according to the present disclosure is 30 μm to 40 μm. If the thickness is too thin, the assembly has poor reliability; if the thickness is too thick, poor assembly uniformity and consistency are resulted.

In an embodiment, in each device unit 1, the metal reinforcing plate 5 is disposed in the middle of the device unit, and the maximum width W1 of the metal reinforcing plate 5 in the first direction is greater than ½ of the spacing between the first electrode 41 and the second electrode 42; the maximum width W2 of the metal reinforcing plate 5 in the second direction is greater than ½ of the width of the device unit in the second direction; the first direction is a direction connecting the center point of the first electrode 41 to the center point of the second electrode 42; and the second direction is a direction parallel to the back of the monolithic substrate and orthogonal to the first direction. Thus, even if the substrate is heated and pressed, the large-sized chip can be evenly stressed due to the support of the metal reinforcing plate.

Additionally, in this embodiment, the metal reinforcing plate 5 is not in contact with the first electrode 41 and the second electrode 42 on the back of the monolithic substrate. Further, the minimum spacing between the metal reinforcing plate 5 and either the first electrode 41 or the second electrode 42 is greater than or equal to 0.3 mm. In this manner, the positive and negative connection can be avoided when electrodes are tinned. In other embodiments, the metal reinforcing plate may be connected to or formed integrally with either the first electrode 41 or the second electrode 42 on the back of the monolithic substrate and separated from the other electrode as long as the minimum spacing between the metal reinforcing plate and the other electrode is greater than or equal to 0.3 mm.

Additionally, the metal reinforcing plate 5 may be formed in a specific shape to indicate electricity. As shown in FIG. 2B, the metal reinforcing plate 5 is formed such that the width of the end facing the first electrode 41 is less than the width of the end facing the second electrode 42, and the electrical properties of the electrodes can be easily checked from the difference.

Figure 6A:
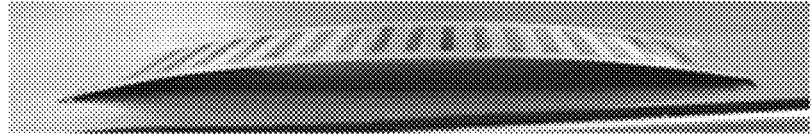
FIG. 6A is a diagram illustrating a monolithic circuit board subjected to die bond baking in the past.

The above describes a situation where the heated and pressed substrate is deformed and dented from the front to the back in the manufacturing process of an optoelectronic device, while in this manufacturing process, a situation also exists where the heated and pressed substrate is dented (as shown in FIG. 6A, the monolithic substrate warps) from the back to the front. This is because the substrate used in the present disclosure is thin and easily deformed under the influence of temperature and pressure; moreover, the area occupied by the chip in the device unit is large so that the area of a metal pad for placing the chip is large to easily form stress, causing deformation. In particular, when heated, the monolithic circuit board easily warps from the back to the front in the direction of the length.

For this, it is further preferred that in the direction of the length of the monolithic circuit board, device units are arranged as follows: the spacing between adjacent device units is greater than or equal to 0.8 times the width of one device unit in the direction of the length. That is, in the preceding step S1, the spacing between the adjacently arranged device units is at least 0.8 device units in the direction of the longer extension length of the monolithic circuit board. In this embodiment, the device units are arranged in the same direction; when the device units are arranged in different directions or the widths of adjacent device units in the direction of the length are inconsistent, the spacing between the preceding adjacent device units is calculated by the width of the wider device unit. In an embodiment, in the direction of the length of the monolithic circuit board, the spacing between adjacent device units is 0.8-1 times the width of one device unit in the direction of the length.

Figure 6B:
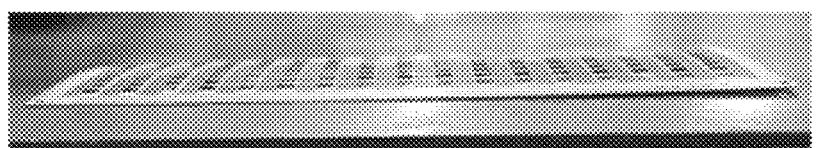
FIG. 6B is a diagram illustrating a monolithic circuit board subjected to die bond baking according to the manufacturing method of the present disclosure.

In this manner, increasing the spacing between the device units in the direction of the length can solve the problem of warping (as shown in FIG. 6B) of the whole board under high temperature treatments such as die bond baking and thus can prevent chips from falling off or cracking. In particular, when the adjacent device units are arranged at a distance of 0.8-1 device units, the preceding warping can be avoided, and the arrangement space of the monolithic substrate can be maximized.

As described above, the method for manufacturing an optoelectronic device according to the present disclosure can solve problems of substrate deformation and chips falling off and cracking during the manufacturing process of optoelectronic devices, thereby improving the yield rate. The method is suitable for manufacturing a device having a large dimension and a thin size, especially suitable for manufacturing an optoelectronic device with the length and width being greater than or equal to 3 mm and the thickness being less than or equal to 1 mm.

The present disclosure further provides an optoelectronic device manufactured by the method for manufacturing the optoelectronic device in any one of the preceding embodiments.

What is claimed is:

1. A method for manufacturing an optoelectronic device, comprising following steps:

S1: dividing a monolithic substrate into a plurality of device unit regions; forming a first pad and a second pad in each of the plurality of device unit regions on a front of the monolithic substrate; forming a first electrode, a second electrode and a metal reinforcing plate in the each of the plurality of device unit regions on a back of the monolithic substrate, wherein the first electrode is electrically connected to the first pad, the second electrode is electrically connected to the second pad, and the metal reinforcing plate is located between the first electrode and the second electrode and has same thickness as the first electrode and the second electrode, so that a device unit is formed in the each of the plurality of device unit regions, thereby obtaining a monolithic circuit board comprising a plurality of device units;

S2: mounting a chip on the first pad of the device unit, and electrically connect the chip to the second pad to obtain a monolithic circuit board with chips;

S3: encapsulating the monolithic circuit board with the chips to obtain a monolithic optoelectronic device; and S4: cutting the monolithic optoelectronic device into individual optoelectronic devices;

wherein a maximum width of the metal reinforcing plate in a first direction is greater than ½ of a spacing between the first electrode and the second electrode, and a width of the metal reinforcing plate in a second direction is greater than ½ of a width of the device unit in the second direction: wherein the first direction is a direction connecting a center point of the first electrode to a center point of the second electrode, and the second direction is a direction parallel to the back of the monolithic substrate and orthogonal to the first direction.

2. The method for manufacturing the optoelectronic device according to claim 1, wherein in the each of the plurality of device units, a minimum spacing between the metal reinforcing plate and the second electrode is greater than or equal to 0.3 mm.

3. The method for manufacturing the optoelectronic device according to claim 2, wherein in the step S1, in a length direction of the monolithic circuit board, a spacing between adjacent ones of the plurality of device units is greater than or equal to 0.8 times a width of one device unit in the length direction.

4. The method for manufacturing the optoelectronic device according to claim 1, wherein in the step S1, in a length direction of the monolithic circuit board, a spacing between adjacent ones of the plurality of device units is greater than or equal to 0.8 times a width of one device unit in the length direction.

5. The method for manufacturing the optoelectronic device according to claim 4, wherein in the step S1, in the length direction of the monolithic circuit board, the spacing between the adjacent ones of the plurality of device units is 0.8 to 1 times the width of one device unit in the length direction.

6. The method for manufacturing the optoelectronic device according to claim 5, wherein a thickness of the monolithic substrate is less than or equal to 0.25 times a thickness of the optoelectronic device.

7. The method for manufacturing the optoelectronic device according to claim 6, wherein an area of the chip is greater than or equal to 0.6 times an area of the optoelectronic device.

8. The method for manufacturing the optoelectronic device according to claim 7, wherein the thickness of the optoelectronic device is less than 1 mm; and when viewed from a top of the optoelectronic device, the optoelectronic device has a square shape with a length and a width each greater than or equal to 3 mm.

9. The method for manufacturing the optoelectronic device according to claim 8, wherein in the step S3, the encapsulation comprises: absorbing, by an upper die of a die press, a back of the monolithic circuit board with the chips; injecting encapsulation adhesive into a lower die of the die press; and closing the upper die and the lower die.

10. The method for manufacturing the optoelectronic device according to claim 1, wherein in the step S1, in a length direction of the monolithic circuit board, a spacing between adjacent ones of the plurality of device units is greater than or equal to 0.8 times a width of one device unit in the length direction.

11. An optoelectronic device, comprising a substrate, a first pad, a second pad, a chip, an encapsulation laver, a wire on the front of the substrate, a first electrode a second electrode, and a metal reinforcing plate on a back of the substrate;

wherein the optoelectronic device corresponds to a device unit;

wherein the first electrode is electrically connected to the first pad, and the second electrode is electrically connected to the second pad; and wherein a maximum width of the metal reinforcing plate in a first direction is greater than ½ of a spacing between the first electrode and the second electrode, and a width of the metal reinforcing plate in a second direction is greater than ½ of a width of the device unit in the second direction; wherein the first direction is a direction connecting a center point of the first electrode to a center point of the second electrode, and the second direction is a direction parallel to the back of the substrate and orthogonal to the first direction.

12. The optoelectronic device according to claim 11, wherein in the device unit, a minimum spacing between the metal reinforcing plate and the second electrode is greater than or equal to 0.3 mm.

13. The optoelectronic device according to claim 11, wherein an area of the chip is greater than or equal to 0.6 times an area of the optoelectronic device.

14. The optoelectronic device according to claim 11, wherein a thickness of the optoelectronic device is less than 1 mm; and when viewed from a top of the optoelectronic device, the optoelectronic device has a square shape with a length and a width each greater than or equal to 3 mm.

* * * * *